United States Patent
Li et al.

(10) Patent No.: US 10,431,707 B2
(45) Date of Patent: Oct. 1, 2019

(54) MONOLITHICALLY INTEGRATED PHOTODETECTOR AND RECEIVER

(71) Applicant: HEWLETT PACKARD ENTERPRISE DEVELOPMENT LP, Houston, TX (US)

(72) Inventors: Cheng Li, Palo Alto, CA (US); Zhihong Huang, Palo Alto, CA (US); Marco Fiorentino, Palo Alto, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 77 days.

(21) Appl. No.: 15/560,649

(22) PCT Filed: Apr. 30, 2015

(86) PCT No.: PCT/US2015/028483
§ 371 (c)(1),
(2) Date: Sep. 22, 2017

(87) PCT Pub. No.: WO2016/175828
PCT Pub. Date: Nov. 3, 2016

(65) Prior Publication Data
US 2018/0097139 A1    Apr. 5, 2018

(51) Int. Cl.
| | | |
|---|---|---|
| H01L 31/10 | (2006.01) | |
| H01L 31/107 | (2006.01) | |
| H04B 10/00 | (2013.01) | |
| H01L 25/04 | (2014.01) | |
| H01L 27/146 | (2006.01) | |
| H04B 10/69 | (2013.01) | |

(52) U.S. Cl.
CPC ......... *H01L 31/107* (2013.01); *H01L 25/041* (2013.01); *H01L 27/14634* (2013.01); *H01L 27/14636* (2013.01); *H04B 10/00* (2013.01); *H04B 10/6911* (2013.01)

(58) Field of Classification Search
CPC ................. H01L 31/107; H01L 25/041; H01L 27/14636; H01L 27/14634; H04B 10/6911; H04B 10/00
See application file for complete search history.

(56) References Cited

U.S. PATENT DOCUMENTS 6,673,645 B2    1/2004    Heineke et al.
8,787,776 B2    7/2014    Carusone et al.
(Continued)

OTHER PUBLICATIONS

Chen, W.Z. et al., "A 3.125 Gbps CMOS Fully Integrated Optical Receiver With Adaptive Analog Equalizer," (Research Paper), IEEE, Nov. 12-14, 2007, pp. 396-399, http://ieeexplore.ieee.org/xpl/articleDetails.jsp?tp=&arnumber=4425714&queryText%3Dmonolithic+.LB.photo+OR+optical.RB.+receiver.
(Continued)

*Primary Examiner* — Tony Ko
(74) *Attorney, Agent, or Firm* — Hewlett Packard Enterprise Patent Department (57) ABSTRACT

An example device in accordance with an aspect of the present disclosure includes an avalanche photodetector to enable carrier multiplication for increased responsivity, and a receiver based on source-synchronous CMOS and including adaptive equalization. The photodetector and receiver are monolithically integrated on a single chip.

15 Claims, 5 Drawing Sheets

(56) References Cited

U.S. PATENT DOCUMENTS

| | | | |
|---|---|---|---|
| 2006/0251375 A1 | 11/2006 | Morse | |
| 2006/0273421 A1* | 12/2006 | Yasuoka | H01L 31/0232 257/438 |
| 2011/0121423 A1* | 5/2011 | Forsyth | H01L 21/225 257/438 |
| 2012/0314757 A1 | 12/2012 | Bulzacchelli et al. | |
| 2013/0147520 A1* | 6/2013 | Payne | H03K 5/2481 327/51 |
| 2014/0138787 A1 | 5/2014 | Hellings et al. | |
| 2014/0186991 A1* | 7/2014 | Huang | H01L 31/107 438/91 |

OTHER PUBLICATIONS

Choi, W-Y. et al., "Si Integrated Photoreceivers," (Research Paper), IEEE, Oct. 4-6, 2010, p. 77-81, http://ieeexplore.ieee.org/xpl/login.jsp?tp=&arnumber=5667948&url=http%3A%2F%2Fieeexplore.ieee.org%2Fiel5%2F5655256%2F5667896%2F05667948.pdf%3Farnumber%3D5667948.

Csutak, S.M. et al., "High-speed Monolithically Integrated Silicon Photoreceivers Fabricated in 130-nm CMOS Technology," (Research Paper), Sep. 2002, pp. 1724-1729, http://ieeexplore.ieee.org/xpl/articleDetails.jsp?tp=&arnumber=1158753&queryText%3DHigh-Speed+Monolithically+Integrated+Silicon+Optical+ReceiverFabricated+in+130-nm+CMOS+Technology.

Csutak, S.M. et al., "High-speed Monolithically Integrated Silicon Optical Receiver Fabricated in 130-nm CMOS Technology," (Research Paper), IEEE, Apr. 2002, pp. 516-518, http://ieeexplore.ieee.org/xpl/articleDetails.jsp?tp=&arnumber=992596&queryText%3DHigh-Speed+Monolithically+Integrated+Silicon+Optical+Receiver+Fabricated+in+130-nm+CMOS+Technology.

International Search Report & Written Opinion received in PCT Application No. PCT/US2015/028483, dated Jan. 28, 2016, 11 pages.

Schaub, J.D. et al., "Lateral PIN Photodiodes for High-speed Silicon Optical Receivers," (Research Paper), Mar. 1, 2013, 9 pages, available at http://photonicssociety.org/newsletters/dec02/industrial_research.html.

Youn, Jin-Sung, "High-Speed Power-Efficient 850-nm Si Optoelectronic Integrated Receivers," (Research Paper), Feb. 2014, 150 pages, http://tera.yonsei.ac.kr/publication/pdf/Jour_2009_JSYoun_PTL.pdf.

C. Li, et al., "A ring-resonator-based silicon photonics transceiver with bias-based wavelength stabilization and adaptive-power-sensitivity receiver", ISSCC 2013, available online at <http://ece.tamu.edu/~spalermo/docs/ring_resonator_si_photonics_xcvr_li_isscc_2013.pdf> , 3 pages.

C. Li, et al., "A Low-Power 26-GHz Transformer-Based Regulated Cascode SiGe BiCMOS Transimpedance Amplifier", IEEE Journal of Solid-State Circuits, available online at http://www.ece.tamu.edu/~spalermo/docs/26GHz_SiGe_TIA_li_jssc_2013.pdf, vol. 48, Issue 5, May 2013, pp. 1264-1275.

* cited by examiner

MONOLITHICALLY INTEGRATED PHOTODETECTOR AND RECEIVER

BACKGROUND

Optical receivers have been based on multiple separate chips, due to the corresponding different technologies used on the various components. For example, a photodiode (PD) or other photodetector may be implemented using an expensive indium gallium arsenide (InGaAs) or gallium arsenide (GaAs) process, in contrast to other receiver components (transimpedance amplifier (TIA), limiting amplifier (LA), and other circuits) that may be fabricated using complementary metal-oxide semiconductor (CMOS) or bipolar junction transistor CMOS (BiCMOS) processes. Thus, CMOS circuits and optical chips used in optical receivers often are based on completely different process and scale. Such separate circuits/chips/dies can be wire-bonded or flip-chip bonded to each other for use in high-speed optical signal detection and recovery. However, such coupling together of the separate circuits by bonding or other schemes can limit the operational speed of the optical receiver, and deteriorate its sensitivity and energy efficiency.

DETAILED DESCRIPTION

Examples described herein enable monolithically integrated optoelectronic circuits to provide an optical receiver as a single CMOS chip, enabling cost-effective, energy efficient, and reliable on-chip communication devices. Examples are operable at optical communication wavelengths, are compatible with silicon (Si) CMOS fabrication processes (e.g., using a 65 nm fabrication node), and can be used for visible light and other wavelength communications, including on-chip short distance interconnects for communications/signaling of computing systems. An example monolithically integrated optoelectronic receiver can therefore be based on cost-efficient standard CMOS technology for high performance computing in a silicon platform.

Figure 1:
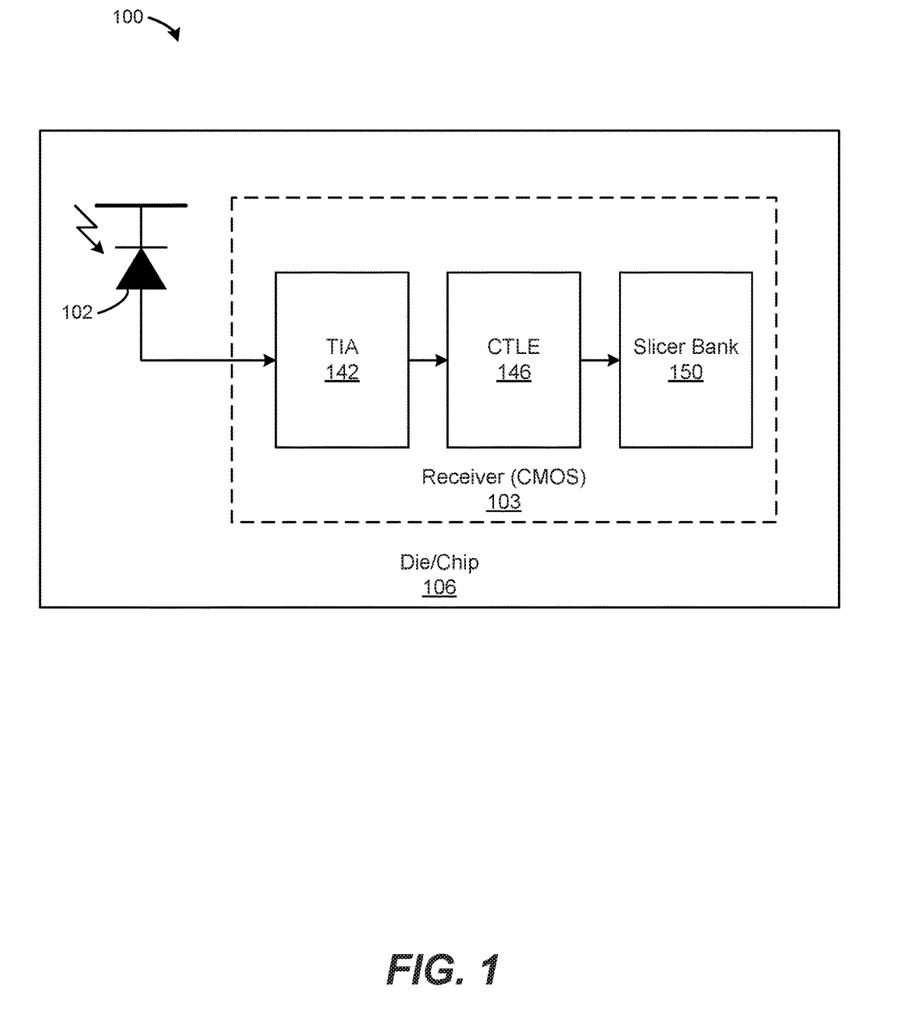
FIG. 1 is a block diagram of a device including a photodetector and a receiver according to an example.

FIG. 1 is a block diagram of a device 100 including a photodetector 102 and a receiver 103 according to an example. The photodetector 102 and receiver 103 are integrated on a single die/chip 106. The receiver 103 includes a transimpedance amplifier (TIA) 142, a continuous-time linear equalizer (CTLE) 146, and a slicer bank 150.

The photodetector 102 is an avalanche photodetector, such as a lateral junction Si-based avalanche photodetector, that can provide gain multiplication based on the avalanche process. The avalanche process enables the photodetector 102 to generate many carriers, multiplying the carriers across the gain for the detector, resulting in improved efficiency and/or responsiveness. The photodetector 102 can use Si as its absorption material for visible light communication, or also can use germanium silicon (GeSi) or other optical absorptive materials to operate at optical communication wavelengths, such as 1.31 micrometers (um) or 1.55 um. Thus, by monolithically integrating the photodetector 102, a high-speed (e.g. 25 Gb/s) optical receiver can be realized in device 100, By avoiding multiple dies bonded together and associated parasitics that would be introduced with various bonding schemes, the speed, energy efficiency, and reliability of the monolithically integrated photodetector 102 and circuits (142, 146, 150, etc.) can be greatly improved.

The receiver 103 may be a source-synchronous CMOS receiver with adaptive equalization. The TIA 142 may be based on a large input-stage feedback resistor (see FIG. 4 for more details), and may be cascaded with an adaptively-tuned CTLE 146 for further improved sensitivity and bandwidth of the receiver 103.

Example devices 100 may operate at very high speeds and efficiencies, such as 25 Gb/s at sub-pJ energy efficiencies for communication applications at visible wavelengths or at telecom wavelengths. Devices 100 also may be used in generally low-speed applications, such as single-photon detector arrays (where a cell of the array may include a photodiode/photodetector 102 and its corresponding integrated CMOS circuitry of the receiver 103). Fully-integrated optical receivers based on device 100 can achieve high sensitivities, with energy efficiencies of sub-pJ/bit for the device 100 including the optical receiver system under a 1 V power supply.

Figure 2:
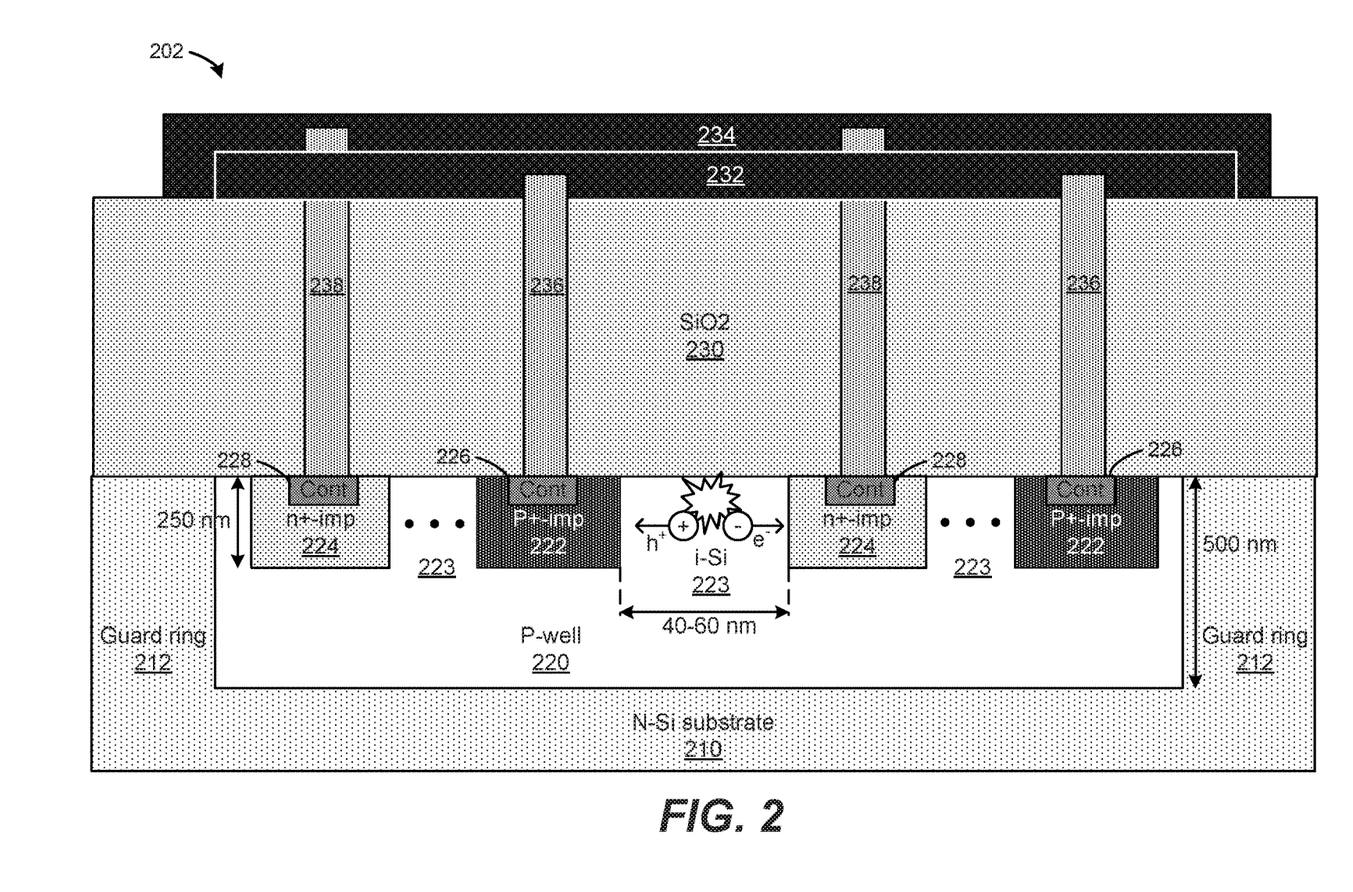
FIG. 2 is a block diagram of a photodetector including a plurality of P regions and a plurality of N regions according to an example.
Figure 3:
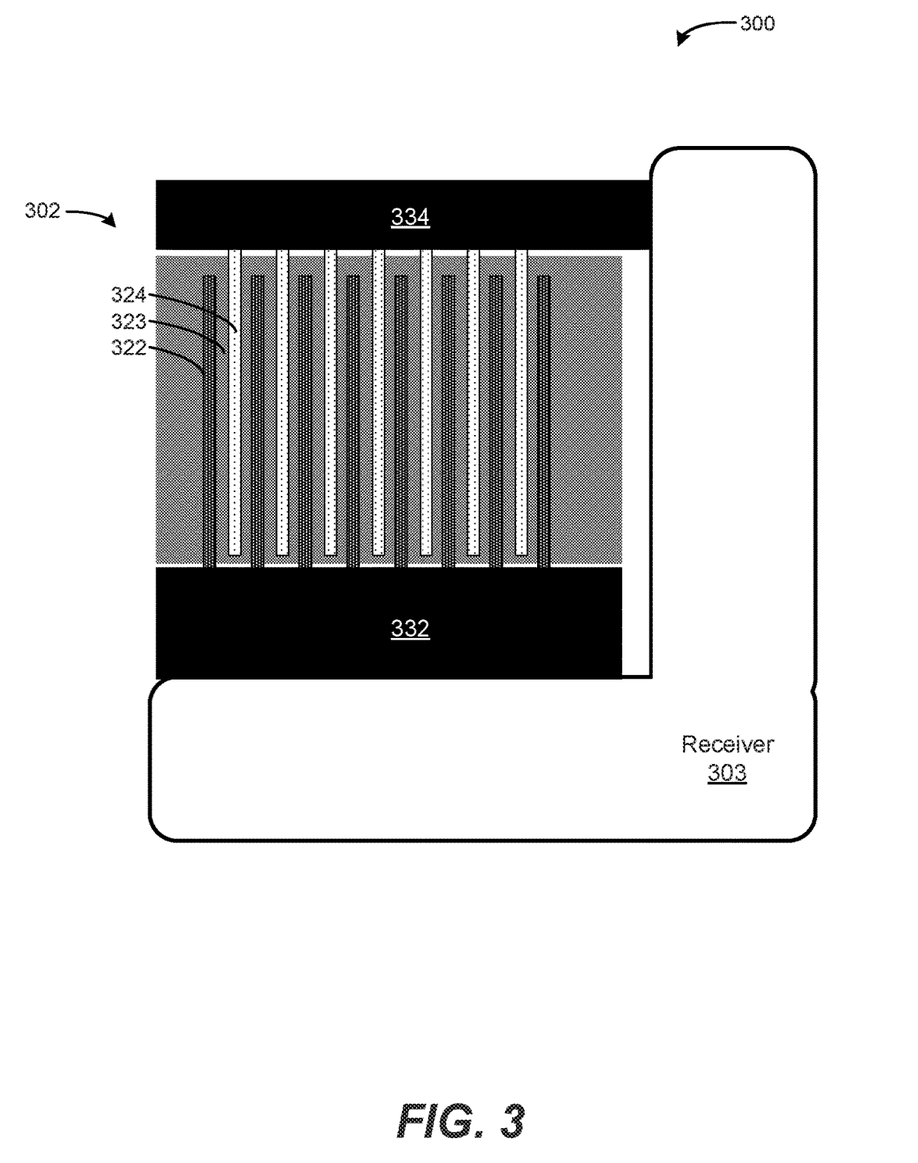
FIG. 3 is a block diagram of a device including a photodetector and a receiver according to an example.

FIG. 2 is a block diagram of a photodetector 202 including a plurality of P regions 222 and a plurality of N regions 224 according to an example. The photodetector 202 is shown in a cross-section side view. The illustrated example photodetector 202 is shown based on Si, although other suitable materials (GeSi, defect Si, or graphene etc.) may be used. The photodetector 202 is formed on substrate 210 (in this case shown as an N—Si substrate), and includes guard rings 212 surrounding the P-well 220. The P regions 222 and N regions 224 are formed in the P-well 220, which includes intrinsic regions 223 therebetween. The P and N regions 222, 224 are shown formed with a depth on the order of approximately 250 to 500 nm, spaced from each other on the order of approximately 40-60 nm, although other spacing distances are acceptable. The finger distances determine the APD breakdown voltage, where typically a 60 nm finger spacing has a 5-7 V breakdown voltage for Silicon material. The P-well 220 is shown formed to have a depth on the order of approximately 500 to 1000 nm. First contacts 226 are formed in the P regions 222, and second contacts 228 are formed in the N regions 224. An oxide layer 230 of SiO2 is formed on top of the substrate 210, and includes first and second vias 236, 238. The first vias 236 are coupled to first contact pad 232, and the second vias 238 are coupled to second contact pad 234. Two P regions 222 and two N regions 224 are illustrated for simplicity, although additional regions 222, 224 are contemplated (e.g., see top view of FIG. 3 showing multiple regions 322, 324).

The example photodetector 202 is fully compatible with Si CMOS foundry processes. The well 220 is shown as a P-well 220 (in view of the substrate 210 being N-type, although the P and N types may be reversed in alternate examples). A negative bias may be applied to deplete the well 220 and take away the photo generated carriers outside the well 220. Inside the P-well 220, the P and N regions 222, 224 are implanted into the well 220 to be formed as interdigitized/spatially spaced fingers, leaving on the order of approximately 40-60 nm spacing of intrinsic region 223 between the junctions. In operation, by adding a voltage as low as a few volts, the narrow space between the p-i-n junction formed by regions 222, 223, 224 can generate large electric field forming carrier multiplication in accordance with the lateral avalanche operation. Thus, the responsivity of the photodetector 202 can be dramatically increased. If using Si alone for the photodetector 202, the photodetector 202 can operate at visible-to-near infrared (on the order of approximately 500 nm-850 nm wavelengths, where silicon shows absorption below 1100 nm). In alternate examples, other materials such as GeSi or graphene may be used as the absorption material, to achieve other (e.g., longer) operating wavelengths suitable for other applications.

The P-well 220 can confine the generated carriers (labeled as h+ and e−), and their ability to drift to the different electrodes formed by first/second contact pads 232/234, based on the photodetector 202 taking advantage of its lateral avalanche photodiode structure. The positive carriers (h+ or holes) and negative carriers (e− or electrons) may be associated with different drift times. The holes can drift through materials relatively slower than the electrons. P-well 220 has a shorter lifetime for the majority carriers, and enables the holes to recombine relatively quickly, enabling the electrons to transfer to the electrodes 232, 234 as a single carrier to increase overall speed of the photodetector 202. The guard rings 212 may be regions, formed in the substrate 210 by carrier diffusion, to collect carriers and shield against latchup or generation of low-impedance paths due to parasitic interactions. Thus, the guard rings 212 are to provide protection to the P-well 220, and can be used to drain the generation of the slower carriers to the substrate, enabling the faster carrier types to transfer to the electrodes 232, 234.

The example photodetector 202 illustrated in FIG. 2 is based on Si, and may be fabricated in a bulk Si CMOS foundry for example, to build such Si avalanche photodetectors 202 that can operate at visible and near infared wavelengths. In alternate examples, the photodetector 202 may incorporate other materials, such as Ge that is epitaxially grown to enable the photodetector 202 to be compatible with a wider range of wavelengths, for operation as optical receivers at communication wavelengths. More specifically, Si has a relatively wide bandgap, capable of absorbing 1.1 micron wavelengths and below. A narrow bandgap material, such as Ge, can be monolithically grown on Si, compatible with absorbing longer wavelengths, e.g., on the order of approximately 1.3 um or 1.55 um. Other materials may similarly be used, such as graphene or an implanted defect detector. Use of Ge enables absorption of up to 1600 nm wavelengths. However, an advantage to the photodetector 202 being based on bulk Si is enabling the flexibility of being able to fabricate devices at Si CMOS foundries, regardless of whether the foundry supports Ge processes. Such foundries can monolithically integrate the Si-based photodetector 202 as well as the receiver circuitry to form the monolithically integrated device that can be fabricated using even a single CMOS process, including fabrication of both the photodetector and the receiver/circuitry at the same time. Thus, unlike other Si-based photonics, there is no need to separately fabricate the Si-based photonics in a photonics foundry, and separately fabricate the CMOS circuitry chips/components in a CMOS foundry (whereby the separate parts would then need to be wire bonded or flip chip bonded together). Accordingly, examples enable a Si-based photodetector 202 as illustrated, operable to detect wavelengths on the order of approximately 850 nm. In alternate examples, the photodetector 202 may include Ge doping to affect the wavelength sensitivity, operable to detect wavelengths on the order of approximately 1310 nm. This design can also be fabricated in CMOS foundry with SOI processes and SiGe processes. By taking advantage of the SOI process, more complicated designs can be implemented to the photonic devices, as well as achieving high performances for the CMOS circuitry. For CMOS foundries with SiGe processes, the SiGe material can be epitaxially grown on the chip and enable device absorption at longer wavelengths that silicon cannot absorb.

The intrinsic region 223 of the photodetector 202 is to form a gap between neighboring P and N regions 222, 224. Thus, photodetector 202 includes a plurality of intrinsic regions 223 (e.g., see FIG. 3 for a plurality of intrinsic regions 323). The width of the intrinsic region 223 is shown as being on the order of approximately 40-60 nm. This distance between P and N regions 222, 224 corresponds to the final breakdown voltage achieved by the photodetector 202, for lateral avalanche carrier multiplication. Increasing the distance results in a higher breakdown voltage. As shown, the distance of approximately 40-60 nm corresponds to a breakdown voltage of approximately 5 V. The chosen distance, or pitch, also may be affected by the accuracy of the fabrication process used to fabricate the photodetector 202. For example, if the photodetector 202 is fabricated using a 65 nm CMOS process, the distance/pitch may be adjusted to a distance equal to or greater than 65 nm (i.e., corresponding to the minimum accuracy that can be achieved by a given CMOS process). As process nodes shrink/improve, such distances/pitches may correspondingly be adjusted.

The avalanche photodetector 202 may be operated near the breakdown voltage corresponding to the arrangement of the photodetector 202. Silicon has an electron and hole ionization rate inversely proportional to the electric field. Silicon starts to ionize above a field of $10^5$ V/cm to generate multiplication gain. By increasing the reverse bias voltage, thus increasing the electric field in between the fingers, the multiplication gain continues to increase until reaching the silicon breakdown field, around $2-5 \times 10^5$ cm/V, depending on its doping concentration of the p-well. The application of additional bias voltage will result in an increase in the gain, responsivity, and sensitivity of the system. Thus, it is not needed to operate the photodetector 202 right at the breakdown voltage. Rather, the photodetector 202 may be operated near its breakdown voltage, which can depend on the geometric dimensions and design of the photodetector 202 (e.g., based on a width of the intrinsic region 223 and/or P, N regions 222, 224 in the example interdigitized finger designs), resulting in breakdown voltage values on the order of approximately 5 to 7 V corresponding to a distance range of 40-60 nm for the width of the intrinsic region 223.

The vias 236, 238 are to electrically couple the contact regions 226, 228 to the first and second contact pads 232, 234. The vias 236, 238 and/or the contact pads 232, 234 may be made of metal, such as copper, tungsten, aluminum, or other metals. The contact regions 226, 228 may be made of heavily doped materials, such as highly N-doped silicon, based on implantation into the P and N regions 222, 224.

FIG. 3 is a block diagram of a device 300 including a photodetector 302 and a receiver 303 according to an example. The photodetector 302 includes a plurality of interdigitized regions, including P regions 322, intrinsic regions 323, and N regions 324. The plurality of P regions 322 are coupled to first contact pad 332, and the plurality of N regions are coupled to second contact pad 334.

The device 300 is shown from a top view, illustrating the lateral junction avalanche photodetector 302 monolithically integrated with the receiver 303 on a single-chip arrangement. The receiver 303 is arranged along two edges of the chip, providing space on the chip for the photodetector 302 to extend across a majority of the chip. The illustrated example lateral/horizontal avalanche photo diode (APD) structure enables simplicity and compatibility with CMOS processes, as the fingers can be implanted together while making the CMOS devices. Although the example photodetector 302 is based on the illustrated interdigitized finger structures of the P and N regions 322, 324 to enable avalanche photodiode operation, alternate examples may use other types of photodetectors 302, for example the vertically implanted APDs and PIN photodetectors.

The P and N regions 322, 324 are implanted into the substrate of the chip as interdigitized or spatially spaced fingers, leaving on the order of approximately 40-60 nm of intrinsic spacing between the junctions. The example APD architecture therefore can improve the responsivity and efficiency in converting optical signals to electrical current. Implementing both the photodetector 302 and the receiver 303 of the device 300 on a single CMOS die results in greatly reduced parasitics, compared to other approaches that bond multiple dies together resulting in reduced responsivity and efficiency (e.g., other approaches having a reduced responsivity below approximately 0.1 amps per watt). In the examples described herein, both the photodetector 302 and the receiver 303 are compatible with fabrication techniques that enable the photodetector 302 and the receiver 303 to be fabricated at the same time, and thus do not need to be fabricated on separate dies using separate fabrication techniques.

Figure 4:
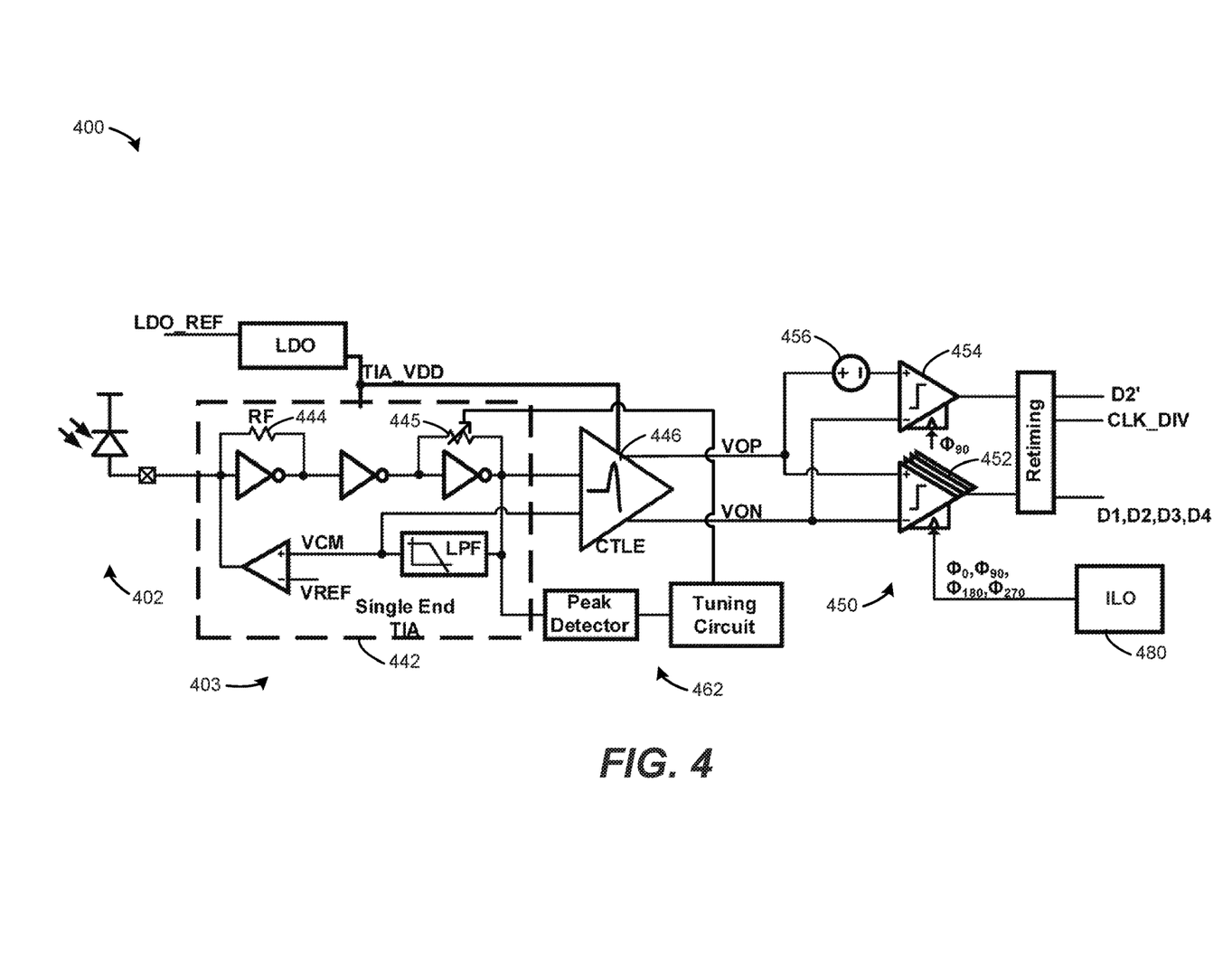
FIG. 4 is a block diagram of a device including a photodetector and a receiver according to an example.

FIG. 4 is a block diagram of a device 400 including a photodetector 402 and a receiver 403 according to an example. The device 400 can operate as a CMOS optical receiver, and also includes a transimpedance amplifier (TIA) 442 coupled to the photodetector 402, a continuous-time linear equalizer (CTLE) 446 coupled to the TIA 442, and a slicer bank 450 coupled to the CTLE 446. An equalization control loop is also coupled to the TIA 442. The TIA 442 also includes feedback resistors 444 and 445, in which resistor 445 is tunable in the resistance. The slicer bank 450 includes a plurality of data slicers 452, and at least one eye monitor slicer 454 associated with an offset 456. Clock 480 is also coupled to the slicer bank 450. The device 400 can provide various outputs from the retiming block, including D1-D4, D2', and CLK_DIV, indicative of the photodetector 402. Such outputs may be used in an equalization control loop (see FIG. 5).

The example device 400 illustrates a quarter-rate data channel receiver. The TIA 442 may be a single end TIA, including three inverter-stages, with feedback resistor RF 444 in the 1st stage, and feedback resistor 445 in the 3rd stage. The TIA 442 also includes a low-pass filter (LPF) and amplifier, to cancel DC offset(s) of the input signal. The TIA 442 and the CTLE 446 can operate according to the injection-locked oscillator (ILO), referred to as clock 480, for improved jitter filtering. The device 400 can operate without needing to compromise between sensitivity/gain and bandwidth, by using the TIA 442 with a large input-stage feedback resistor 444, cascaded with the CTLE 446 that compensates for the increased input pole. The equalization control loop 560 in FIG. 5 adapts the peaking of the CTLE 446 to accommodate variations in input capacitance (e.g., due to variations between different photodetectors 402). More specifically, the device 400 can achieve a high gain, without needing to reduce bandwidth. For example, the CTLE 446 can perform some equalization in its portion of the circuit, and therefore can reduce the gain and extend the bandwidth for the entire circuit. Accordingly, the device 400 can achieve high gain with high bandwidth overall. Furthermore, the CTLE 446 can selectively be disabled to achieve higher gain, at the cost of some bandwidth reduction, for use in lower bandwidth applications (e.g., targeting 10 Gbit/sec applications).

The slicer bank 450 can be provided as digital back-end circuitry to convert analog signals (VOP, VON) to the digital domain outputs. The peak detector and tuning circuits can be used to detect peak values of the TIA 442, to be used for automatic gain control (AGO) 462.

The large input-stage feedback resistor TIA 442 cascaded with the adaptively-tuned CTLE 446 can improve sensitivity and bandwidth of the device 400. Reduction in bandwidth, that can be associated with the large input-stage feedback resistor TIA, can be compensated for by the equalization applied to the CTLE 446, a beneficial result of cascading the TIA 442 with the CTLE 446 to extend the bandwidth. Furthermore, the device 400 may be used to target different applications and corresponding different bandwidth needs. For example, if targeting for a 10 Gb/s application, the CTLE 446 can be disabled, to reduce bandwidth (e.g., from 17 GHz to 10 GHz) and thereby avoid introducing extra noise into the receiver band, improving noise performance compared to the wide-bandwidth receiver system. In an example, the CTLE 446 may be selectively enabled or disabled by external control signals per the adaptively-tuned CTLE 446.

The slicer bank 450 is used to convert signals in the analog domain to the digital domain. In contrast to a single group of slicers, the illustrated example slicer bank 450 includes a first set of data slicers 452 (four are illustrated, although other numbers may be used) coupled with at least one eye monitor slicer 454. The eye monitor slicer 454 is to sense the bit error rate (BER) of the circuits. The plurality of data slicers 452 are based on a first scale reference. However, the eye monitor slicer 454 is based on a second reference that is slightly higher or lower than the first reference, e.g., based on offset 456. Thus, when the slicer bank 450 encounters the occurrence of a BER, the BER of the eye monitor slicer 454 will be relatively much different than the BER of the data slicers 452. This difference, as indicated by the eye monitor slicer 454 relative to the data slicers 452, can be used by the device 400 as an indication that the BER is changing, e.g., increasing or decreasing. That information regarding the trend of the BER can be used to provide feedback to the circuits, e.g., to either reduce the gain, or increase the gain, according to such predicted changes/trends in the BER. Thus, the example devices may use adaptive gain control, based at least in part on the slicer bank 450, to provide improved circuit performance.

The clock 480 may be provided as a low-complexity optically-clocked source-synchronous receiver based on an LC injection-locked oscillator (ILO) with jitter filtering. The clock 480 may be provided as an on-chip clock, as illustrated. In alternate examples, e.g., when targeting different applications, the clock signal may be provided from an external clean clock signal (e.g., from a source that is not integrated into the single chip of the device 400).

Figure 5:
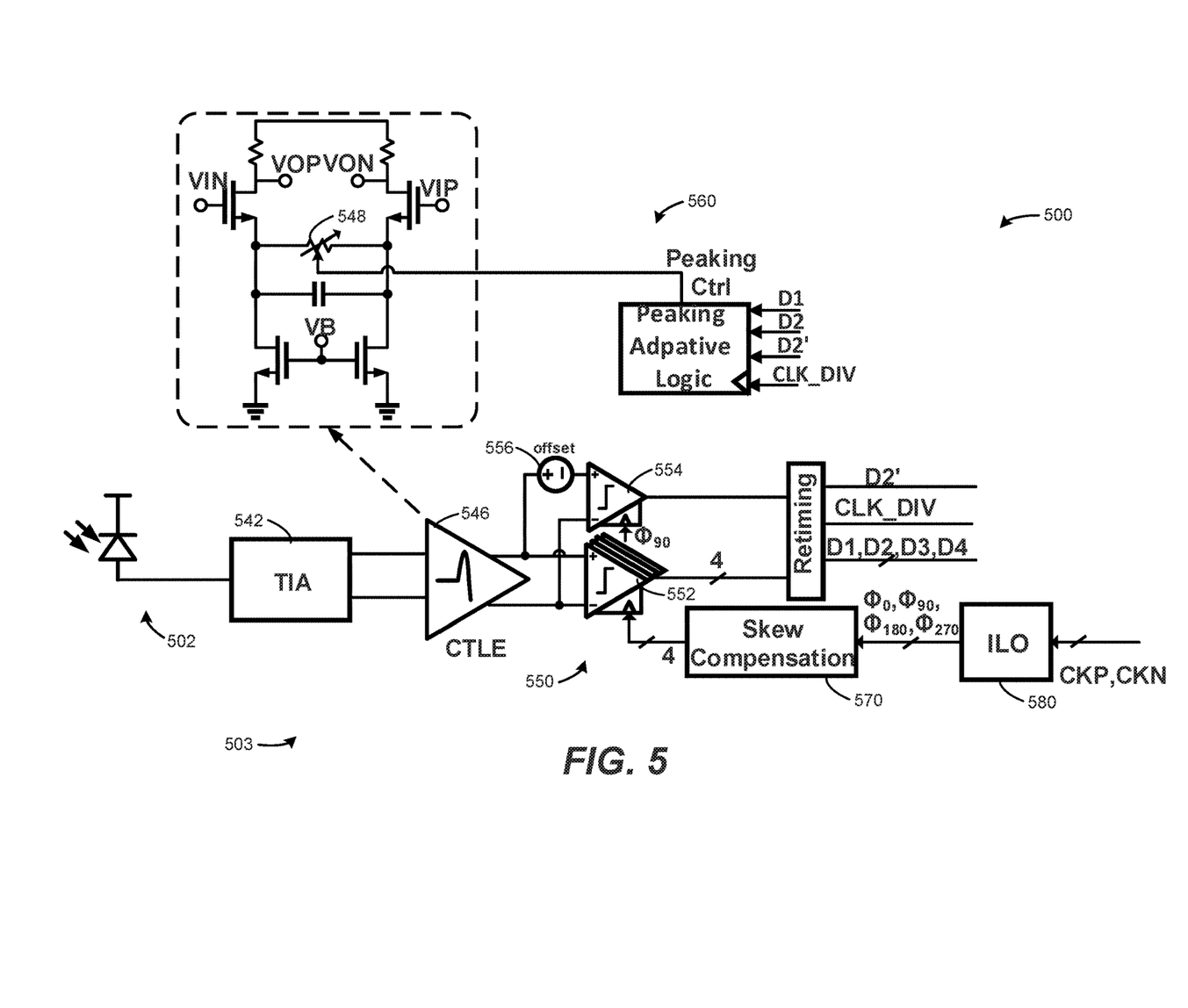
FIG. 5 is a block diagram of a device including a photodetector and a receiver according to an example.

FIG. 5 is a block diagram of a device 500 including a photodetector 502 and a receiver 503 according to an example. As with the device 400 of FIG. 4, the device 500 may be monolithically integrated into a single chip, and may be based on the various example photodetectors and circuitry as described herein. The device 500 also includes TIA 542, CTLE 546, slicer bank 550, equalization control loop 560, skew compensation 570, and clock 580. The CTLE 546 includes a peaking resistor 548 (as shown in the detail inset view of the CTLE 546), adjustable by the peaking control of the peaking adaptive logic of the equalization control loop 560. The slicer bank 550 includes data slicers 552 and eye monitor slicer 554. The eye monitor slicer 554 is associated with an offset 556.

Device 500 is an example monolithically integrated optical receiver that includes the TIA 542 followed by the adaptively-tuned CTLE 546 peaking at high-frequency to extend the overall bandwidth of the device 500. The four main data slicers 552 perform 1:4 demultiplexing following the CTLE 546. The additional slicer 554 including the offset 556 functions as an eye monitor to control the peaking adaptive logic of the equalization control loop 560. The equalization control loop 560 is to adapt the CTLE peaking to accommodate various applications associated with different speed requirements. The peaking adaptive logic is to compare the eye monitor output (D2') of the eye monitor slicer 554 with the normal data comparator output (D2) on the same clock phase (CLK_DIV). For example, the peaking adaptive logic can detect monitor eye-closure before a bit-error actually occurs at the data slicers 552, for a given low bandwidth example. This indicates to the peaking adaptive logic to adjust the value of the CTLE peaking resistor 548 to equalize the gain and extend the bandwidth.

The device 500 can compensate for thousands or even tens of thousands of photodetectors 502 at the input of the receiver 503 that may affect the input pole due to variations in the parasitic capacitances associated with various different photodetectors 502. A given photodetector 502 may have a higher or lower capacitance than another given photodetector 502, and the device 500 includes equalization control loop 560 and other features to adjust and compensate for such variations. Accordingly, the example devices described herein are robust and enable smart receiver capability, whether connected to a single avalanche photodetector 502 or an array of thousands of photodetectors 502.

What is claimed is:

1. A device comprising:
   an avalanche photodetector to enable carrier multiplication for increased responsivity; and
   a receiver including a transimpedance amplifier (TIA), an adaptively-tuned continuous-time linear equalizer (CTLE) cascaded with the TIA, and a slicer bank coupled to the CTLE to identify a data pass bit error rate (BER), wherein the receiver is based on source-synchronous complementary metal-oxide semiconductor (CMOS);
   wherein the photodetector and receiver are monolithically integrated on a single chip.

2. The device of claim 1, wherein the avalanche photodetector is a lateral junction avalanche photodetector including a plurality of P regions and a plurality of N regions implanted in a substrate as interdigitized spatially spaced fingers having intrinsic spacing therebetween.

3. The device of claim 2, further comprising a well disposed in the substrate, wherein the plurality of P and N regions are embedded in the well, and the well is depletable by application of a bias to take away photo generated carriers outside the well.

4. The device of claim 3, further comprising guard rings disposed on a periphery of the well to apply the bias to drain slower carriers to the substrate and enable faster carriers to transfer to at least one of the P and N regions.

5. The device of claim 2, wherein the intrinsic spacing between the interdigitized spatially spaced fingers is on the order of approximately 40-60 nanometers (nm).

6. The device of claim 1, wherein the receiver includes adaptive equalization.

7. The device of claim 1, wherein the slicer bank includes at least one data slicer associated with a data pass bit error rate (BER), and at least one eye monitor slicer to sense a monitor slicer BER.

8. A device comprising:
   a lateral junction avalanche photodetector including a plurality of P regions and a plurality of N regions implanted in a substrate as interdigitized spatially spaced fingers having intrinsic spacing therebetween, to enable carrier multiplication for increased responsivity; and
   a receiver based on source-synchronous CMOS and including adaptive equalization;
   wherein the photodetector and receiver are monolithically integrated on a single chip.

9. The device of claim 8, wherein the receiver further comprises a transimpedance amplifier (TIA) including a large input-stage feedback resistor.

10. The device of claim 8, wherein the receiver further comprises an adaptively-tuned continuous-time linear equalizer (CTLE) cascaded with the TIA to compensate for parasitic capacitance of the photodetector, wherein the CTLE includes the capability of being selectively enabled and disabled according to desired bandwidth and gain characteristics for the receiver.

11. The device of claim 10, wherein the receiver further comprises an equalization control loop to adapt the CTLE peaking to accommodate variations in input capacitance associated with given photodetectors.

12. The device of claim 8, wherein the receiver is clocked to synchronize data channels with a clock based on at least one of i) an on-chip clock source, and ii) an external clock.

13. The device of claim 8, wherein the receiver further comprises a slicer bank including a plurality of data slicers associated with a data pass bit error rate (BER), and at least one eye monitor slicer to sense a monitor slicer BER.

14. The device of claim 13, wherein the eye monitor slicer is provided with an offset corresponding to an increased voltage sweep relative to the data slicers.

15. A device comprising:
   a lateral junction avalanche photodetector including a plurality of P regions and a plurality of N regions implanted in a substrate as interdigitized spatially spaced fingers having intrinsic spacing therebetween, to enable carrier multiplication for increased responsivity; and
   a receiver including a transimpedance amplifier (TIA), an adaptively-tuned continuous-time linear equalizer (CTLE) cascaded with the TIA, and a slicer bank coupled to the CTLE to identify a data pass bit error rate (BER), wherein the receiver is based on source-synchronous complementary metal-oxide semiconductor (CMOS);
   wherein the photodetector and receiver are monolithically integrated on a single chip.

* * * * *